US008283101B2

(12) United States Patent
Hauck et al.

(10) Patent No.: US 8,283,101 B2
(45) Date of Patent: Oct. 9, 2012

(54) IMAGEABLE ELEMENTS WITH IMPROVED ABRASION RESISTANCE

(75) Inventors: Gerhard Hauck, Badenhausen (DE); Celin Savariar-Hauck, Badenhausen (DE)

(73) Assignee: Eastman Kodak Company, Rochester, NY (US)

( * ) Notice: Subject to any disclaimer, the term of this patent is extended or adjusted under 35 U.S.C. 154(b) by 911 days.

(21) Appl. No.: 11/847,368

(22) Filed: Aug. 30, 2007

(65) Prior Publication Data

US 2009/0061352 A1 Mar. 5, 2009

(51) Int. Cl.
*G03F 7/00* (2006.01)
*G03F 7/26* (2006.01)

(52) U.S. Cl. ............... 430/270.1; 430/273.1; 430/281.1; 430/138; 101/450.1; 101/453; 101/463.1

(58) Field of Classification Search ............... 430/270.1, 430/302
See application file for complete search history.

(56) References Cited

U.S. PATENT DOCUMENTS

| | | | | |
|---|---|---|---|---|
| 3,816,117 | A * | 6/1974 | Kaukeinen | 430/67 |
| 5,908,731 | A | 6/1999 | Leenders et al. | |
| 5,985,515 | A * | 11/1999 | Van Rompuy et al. | 430/272.1 |
| 6,352,811 | B1 | 3/2002 | Patel et al. | |
| 6,461,792 | B1 * | 10/2002 | Kawamura et al. | 430/271.1 |
| 6,534,238 | B1 * | 3/2003 | Savariar-Hauck et al. | 430/270.1 |
| 6,555,291 | B1 | 4/2003 | Hauck | |
| 7,217,502 | B2 | 5/2007 | Ray et al. | |
| 2002/0009671 | A1 | 1/2002 | Gries et al. | |
| 2003/0113654 | A1 * | 6/2003 | Savariar-Hauck | 430/165 |
| 2004/0131966 | A1 * | 7/2004 | Oda | 430/270.1 |
| 2004/0191675 | A1 * | 9/2004 | Verschueren et al. | 430/270.1 |
| 2004/0191678 | A1 * | 9/2004 | Vermeersch et al. | 430/270.1 |
| 2006/0130689 | A1 | 6/2006 | Muller et al. | |
| 2007/0141485 | A1 * | 6/2007 | Yau et al. | 430/14 |
| 2007/0231740 | A1 * | 10/2007 | Yanaka et al. | 430/270.1 |

FOREIGN PATENT DOCUMENTS

| | | |
|---|---|---|
| EP | 1 057 622 | 12/2000 |
| EP | 1 101 608 | 5/2001 |
| EP | 1506858 | 2/2005 |
| EP | 1588860 | 10/2005 |
| EP | 1621338 | 2/2006 |
| EP | 1669195 | 6/2006 |
| EP | 1707353 | 10/2006 |
| EP | 1738900 | 1/2007 |
| EP | 1747900 | 1/2007 |
| EP | 1754614 | 2/2007 |
| EP | 1801651 | 6/2007 |

OTHER PUBLICATIONS

U.S. Appl. No. 11/686,981, filed Mar. 16, 2007 titled Processing Positive-Working Imageable Elements With High pH Developers, by C. Savariar-Hauck et al.

(Continued)

*Primary Examiner* — Cynthia Kelly
*Assistant Examiner* — Chanceity Robinson
(74) *Attorney, Agent, or Firm* — J. Lanny Tucker

(57) ABSTRACT

Single- and multi-layer positive-working imageable elements include an ink receptive outer layer that includes inorganic, non-metallic, inert discrete particles, such as nano-sized silica, aluminum oxide, or titanium dioxide particles. The presence of these particles in the outermost layer improves the abrasion and scratch resistance of the elements.

14 Claims, 1 Drawing Sheet

OTHER PUBLICATIONS

VP Disp.CO 1030/Mar. 2007 “Dispersion of AEROSIL® R 9200 (hydrophobic, fumed silica) in methoxy propyl acetate (30%)” Degussa AG—Preliminary Product Information.

Fabre Und Lack, 113.Jahrgang, Jul. 2007, “Nano-$SiO_{40}$ in PUR-Klarlacken” by Andreas Brinkmann et al.

* cited by examiner

IMAGEABLE ELEMENTS WITH IMPROVED ABRASION RESISTANCE

FIELD OF THE INVENTION

This invention relates to positive-working imageable elements having improved abrasion and scratch resistance, and to methods of imaging and developing these imageable elements particularly to provide lithographic printing plates.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Imageable elements for the preparation of lithographic printing plates have been developed for use with infrared lasers. Thermally imageable, multi-layer elements are described, for example, in U.S. Pat. Nos. 6,294,311 (Shimazu et al.), 6,352,812 (Shimazu et al.), 6,593,055 (Shimazu et al.), 6,352,811 (Patel et al.), and 6,528,228 (Savariar-Hauck et al.), and U.S. Patent Application Publication 2004/0067432 A1 (Kitson et al.). U.S. Patent Application Publication 2005/0037280 (Loccufier et al.) describes heat-sensitive printing plate precursors that comprise a phenolic developer-soluble polymer and an infrared radiation absorbing agent in the same layer.

Additional positive-working thermally imageable elements are described and used for making lithographic printing plates using various developers in U.S. Pat. Nos. 6,200,727 (Urano et al.), 6,358,669 (Savariar-Hauck et al), and 6,534,238 (Savariar-Hauck et al.). In some instances, such imageable elements are developed using low pH developers when the upper layer includes novolak resins and dissolution suppressing agents.

Single-layer, positive-working imageable elements are described for example, in U.S. Pat. Nos. 6,280,899 (Hoare et al.), 6,391,524 (Yates et al.), 6,485,890 (Hoare et al.), 6,558,869 (Hearson et al.), and 6,706,466 (Parsons et al.), and U.S. Patent Application Publication 2006/0130689 (Müller et al.).

Copending and commonly assigned, U.S. Ser. No. 11/686,981 (filed Mar. 16, 2006 by Savariar-Hauck et al.) describes and claims a method of processing positive-working imageable elements to prepare lithographic printing plates. Other imageable elements are described in U.S. Pat. No. 6,555,291 (Savariar-Hauck).

Particulate materials have been incorporated into lithographic printing plate precursors for various reasons. For example, organic polymer particles have been incorporated into such elements for improved press developability as described in U.S. Pat. No. 6,352,811 (Patel et al.). Nanopastes of metallic particles are described for imageable elements in U.S. Pat. No. 7,217,502 (Ray et al.). Core-shell particles have been included in imaging layers so they coalesce upon imaging as described for example in EP 1,057,622 (Fukino et al.).

PROBLEM TO BE SOLVED

Imageable elements such as lithographic printing plate precursors are generally packaged and shipped after manufacture in multiple units or stacks with interleaving paper between individual elements. During manufacturing, packaging, transport, and subsequent use of the imageable elements, the outermost layers can be scratched or abraded from human or machine handling. Damage to the outer layer of such elements, for example from scratches, can produces "holes" or other defects in the resulting images, which is a major problem. Another problem is the potential for "dusting" that may occur in imaging equipment such as platesetters. There is a need to improve the abrasion resistance of the outermost layers in these elements to reduce scratching and other physical defects, without any increase in dust.

SUMMARY OF THE INVENTION

This invention provides a positive-working imageable element comprising a substrate having thereon, one or more imageable layers, the outermost of which imageable layers comprises inorganic, non-metallic, inert discrete particles dispersed within a polymeric binder that is insoluble in an alkaline developer before thermal imaging and is soluble in the alkaline developer after thermal imaging, the element further comprising a radiation absorbing compound, the discrete particles having an average particle size of from about 1 nm to about 0.5 μm, and being present in the outermost imageable layer in an amount of at least 1% based on total outermost imageable layer dry weight.

This invention also provides a plurality of positive-working imageable elements arranged in a stack with interleaving paper between each individual positive-working imageable element, each positive-working individual imageable element comprising a substrate having thereon, one or more imageable layers, the outermost of which imageable layers comprises inorganic, non-metallic, inert discrete particles dispersed within a polymeric binder that is insoluble in an alkaline developer having a pH of at least 12 before thermal imaging and is soluble in the alkaline developer after thermal imaging, the element further comprising a radiation absorbing compound, the discrete particles having an average particle size of from about 1 nm to about 0.5 μm, and being present in the outermost imageable layer in an amount of at least 1% based on total outermost imageable layer dry weight.

This invention also provides a method of making an imaged element (for example, a lithographic printing plate) comprising:

A) imaging the positive-working imageable element of this invention to provide an imaged element with exposed regions and non-exposed regions, and B) developing the imaged element to remove only the exposed regions with an alkaline developer.

The positive-working imageable elements of this present invention include those having a single imageable layer as well as those having multiple imageable layers (such as inner and outer layers).

The present invention provides positive-working imageable elements having improved abrasion resistance because of the incorporation into the outermost imageable layer of the inorganic, non-metallic, inert discrete particles described herein. The increased abrasion resistance reduces scratches and other physical defects in the outermost layer so there are reduced defects in the resulting images. In addition, we found that the present invention also provides reduced "dust" in imaging equipment.

DETAILED DESCRIPTION OF THE INVENTION

Definitions

Figure 1A:
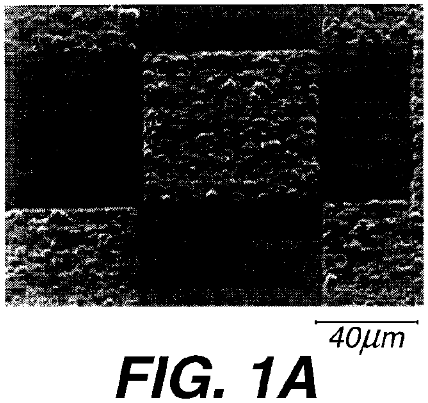
FIGS. 1*a*, 1*b*, 2*a*, 2*b*, 3*a*, 3*b*, 4*a*, and 4*b* are scanning electron micrograph (SEM) images that show the surface properties of coated layers as described for Comparative Example 1 and Invention Examples 1-3 below.

Unless the context indicates otherwise, when used herein, the terms "imageable element", "positive-working imageable element", and "printing plate precursor" are meant to be references to embodiments of the present invention.

In addition, unless the context indicates otherwise, the various components described herein such as "inorganic, non-metallic, inert discrete particles", "primary polymeric binder", "secondary polymeric binder", "dissolution inhibitor", "radiation absorbing compound", and similar terms also refer to mixtures of such components. Thus, the use of the article "a" or "an" is not necessarily meant to refer to only a single component.

By "single-layer" imageable element, we mean an imageable element of this invention that has only a single layer needed for providing an image. The inorganic, non-metallic, inert discrete particles (defined below) would be located in this single imageable layer that is usually the outermost layer. However, such elements may comprise additional non-imaging layers on either side of the substrate and underneath the imageable layer.

By "multilayer" imageable element, we mean an imageable element of this invention that has at least two layers required for providing an image, for example, "inner" and "outer" layers as described below. However, such elements may comprise additional non-imaging layers on either side of the substrate. The non-metallic, inert discrete particles (defined below) would generally be in the outermost layer (for example, the outer layer).

By the term "remove said exposed regions" during development, we mean that the exposed regions of the outermost layer and the corresponding regions of any underlying layers are selectively and preferentially removed by the developer, but not the non-exposed regions.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The imageable elements described herein can be used in a number of ways such as precursors to lithographic printing plates as described in more detail below. However, this is not meant to be their only use. For example, the imageable elements can also be used as thermal patterning systems and to form masking elements and printed circuit boards.

Particles for Abrasion Resistance

The particles used in the outer imageable layers according to this invention are inorganic and thus do not include the organic polymeric particles described for example, in U.S. Pat. No. 6,352,811 (noted above). In addition, the particles are non-metallic, and do not include metallic particles such as those used in the nanopastes described for example in U.S. Pat. No. 7,217,502 (noted above).

In addition, the useful particles are "inert" meaning that they do not have appreciable surface reactivity (surface reactive groups). Thus, the particles do not react with the surrounding polymeric binder or other components of the imageable layer to any appreciable extent. Such reactivity is not needed for providing the desired properties of this invention.

The particles are also generally discrete, meaning that they are uniformly dispersed in the polymeric binder throughout the imageable layer. There is generally little clumping or agglomerations. To achieve such uniform dispersions, the particles can be mixed well into the one or more polymeric binders using the ball mill, sand mill, high-shear fluid flow mill, or other well known mixing techniques. With the selection of appropriate additives, stable dispersions of the particles in organic solvents can be obtained in desired proportions to provide formulations to provide optimum properties.

The inorganic, non-metallic, inert particles generally have an average particle size of from about 1 nm to about 0.5 μm, and typically from about 10 to about 300 nm. These particles are generally present in the outermost imageable layer in an amount of at least 1%, and typically from about 5 to about 50% or from about 8 to about 30%, based on the total outermost layer dry weight.

Particles that are useful in the practice of this invention include but are not limited to, particles of silica, aluminum oxide, and titanium dioxide. There are a number of commercial sources for such particles of the desired size. For example, useful silica particles can be obtained as VP Disp. CP1030 that is a 30 weight % dispersion of Aerosil R9200 hydrophobic fumed silica, from Degussa. Useful particles of aluminum oxide can be obtained as the commercial product A-Mite™ that is available from American Elements (Los Angeles, Calif.), and useful titanium dioxide particles are described for example, in U.S. Pat. No. 6,974,611 (Sakatani et al.).

Single-Layer Imageable Elements

In the single-layer imageable elements include the inorganic, non-metallic, inert discrete particles in the single and outermost imageable layer.

In general, single-layer imageable elements are formed by suitable application of an imageable layer formulation containing one or more polymeric binders and the discrete particles to a suitable substrate to form an imageable layer. This substrate is usually treated or coated in various ways as described below prior to application of the formulation. The substrate can be treated to provide an "interlayer" for improved adhesion or hydrophilicity, and the single imageable layer is applied over the interlayer.

The substrate generally has a hydrophilic surface, or at least a surface that is more hydrophilic than the applied imageable layer formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A useful substrate is composed of an aluminum-containing support that may be coated or treated using techniques known in the art, including physical graining, electrochemical graining, chemical graining, and anodizing. For example, the aluminum sheet can be anodized using phosphonic acid or sulfuric acid using conventional procedures.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid-acrylic acid copolymer, poly(acrylic acid), or (meth)acrylic acid copolymer, or mixtures thereof. For example, the grained and/or anodized aluminum support can be treated with poly(phosphonic acid) using known procedures to improve surface hydrophilicity to provide a lithographic hydrophilic substrate.

The thickness of the substrate can be varied but should be sufficient to sustain the wear from printing and thin enough to wrap around a printing form. Such embodiments typically include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press or a sleeve that is incorporated onto a press cylinder. The use of such imaged cylinders is described for example in U.S. Pat. No. 5,713,287 (Gelbart).

The imageable element also includes one or more radiation absorbing compounds. While these compounds can be sensitive to any suitable energy form (for example, UV or visible radiation), they are usually sensitive to infrared radiation and thus, the radiation absorbing compounds can be infrared radiation absorbing compounds ("IR absorbing compounds") that absorb radiation from about 600 to about 1200 nm and typically from about 700 to about 1200 nm.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. Nos. 4,973,572 (DeBoer), 5,208,135 (Patel et al.), 5,244,771 (Jandrue Sr. et al.), and 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S Patent Application Publication 2005-0130059 (Tao). A general description of one class of suitable cyanine dyes is shown by the formula in paragraph 0026 of WO 2004/101280 (Munnelly et al.).

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (Hauck et al.), 6,264,920 (Achilefu et al.), 6,153,356 (Urano et al.), and 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® or CAB-O-JET® 300

(manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The radiation absorbing compound is generally present in the imageable element in an amount sufficient to render the imageable layer insoluble to an aqueous developer after exposure to appropriate radiation. This amount is generally at least 0.5% and up to 30 weight % and typically from about 3 to about 10 weight % (based on total dry layer weight). The particular amount needed for this purpose would be readily apparent to one skilled in the art, depending upon the specific compound used and the properties of the alkaline developer to be used. In most embodiments, the radiation absorbing compound is present in the single imageable layer. Alternatively or additionally, radiation absorbing compounds may be located in a separate layer that is in thermal contact with the single imageable layer. Thus, during imaging, the action of the radiation absorbing compound can be transferred to the imageable layer without the compound originally being incorporated into it.

In addition, solubility-suppressing components are optionally incorporated into the imageable layer. Such components act as dissolution inhibitors that function as solubility-suppressing components for the polymeric binders. Dissolution inhibitors typically have polar functional groups that are believed to act as acceptor sites for hydrogen bonding with various groups in the polymeric binders. The acceptor sites comprise atoms with high electron density, and can be selected from electronegative first row elements such as carbon, nitrogen, and oxygen. Dissolution inhibitors that are soluble in the alkaline developer are useful. Useful polar groups for dissolution inhibitors include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetralkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France).

The polymeric binders used in the imageable layer are generally soluble in alkaline developers (defined below) after thermal imaging. They can be poly(vinyl phenols) or derivatives thereof, or phenolic polymers. These polymeric binders are distinguishable from other polymeric binders that may be present in one or more layers of the imageable elements by the presence of carboxylic (carboxy), sulfonic (sulfo), phosphonic (phosphono), or phosphoric acid groups that are incorporated into the polymer molecule.

The resins useful as second polymeric binders include but are not limited to, poly(hydroxystyrenes), novolak resins, resole resins, poly(vinyl acetals) having pendant phenolic groups, and mixtures of any of these resins (such as mixtures of one or more novolak resins and one or more resole resins). The novolak resins are most preferred.

Generally, such resins have a number average molecular weight of at least 3,000 and up to 200,000, and typically from about 6,000 to about 100,000, as determined using conventional procedures. Most of these types of resins are commercially available or prepared using known reactants and procedures. For example, the novolak resins can be prepared by the condensation reaction of a phenol with an aldehyde in the presence of an acid catalyst. Typical novolak resins include but are not limited to, phenol-formaldehyde resins, cresol-formaldehyde resins, phenol-cresol-formaldehyde resins, p-t-butylphenol-formaldehyde resins, and pyrogallol-acetone resins, such as novolak resins prepared from reacting m-cresol or a m,p-cresol mixture with formaldehyde using conventional conditions. For example, some useful novolak resins include but are not limited to, xylenol-cresol resins, for example, SPN400, SPN420, SPN460, and VPN1100 (that are available from AZ Electronics) and EP25D40G and EP25D50G (noted below for the Examples) that have higher molecular weights, such as at least 4,000.

Other useful resins include polyvinyl compounds having phenolic hydroxyl groups, include poly(hydroxystyrenes) and copolymers containing recurring units of a hydroxystyrene and polymers and copolymers containing recurring units of substituted hydroxystyrenes.

Also useful are branched poly(hydroxystyrenes) having multiple branched hydroxystyrene recurring units derived from 4-hydroxystyrene as described for example in U.S. Pat. Nos. 5,554,719 (Sounik) and 6,551,738 (Ohsawa et al.), and U.S. Published Patent Applications 2003/0050191 (Bhatt et al.) and 2005/0051053 (Wisnudel et al.), and in copending and commonly assigned U.S. patent application Ser. No. 11/474,020 (filed Jun. 23, 2006 by Levanon et al.), that is incorporated herein by reference. For example, such branched hydroxystyrene polymers comprise recurring units derived from a hydroxystyrene, such as from 4-hydroxystyrene, which recurring units are further substituted with repeating hydroxystyrene units (such as 4-hydroxystyrene units) positioned ortho to the hydroxy group. These branched polymers can have a weight average molecular weight ($M_w$) of from about 1,000 to about 30,000, preferably from about 1,000 to about 10,000, and more preferably from about 3,000 to about 7,000. In addition, they may have a polydispersity less than 2 and preferably from about 1.5 to about 1.9. The branched poly(hydroxystyrenes) can be homopolymers or copolymers with non-branched hydroxystyrene recurring units.

One group of useful polymeric binders are poly(vinyl phenol) and derivatives thereof. Such polymers are obtained generally by polymerization of vinyl phenol monomers, that is, substituted or unsubstituted vinyl phenols. Substituted vinyl phenol recurring units include those described below for the "a" recurring units in Structure (I). Some vinyl phenol copolymers are described in EP 1,669,803A (Barclay et al.).

Other useful polymeric binders are modified novolak or resole resins that are represented in the following Structure (I):

(I)

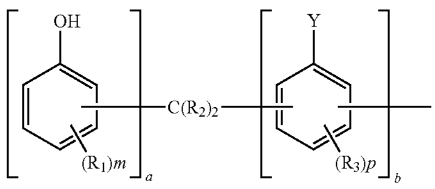

wherein

Y is

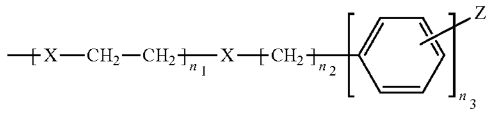

a is from about 90 to about 99 mol % (typically from about 92 to about 98 mol %), b is from about 1 to about 10 mol % (typically from about 2 to about 8 mol %), $R_1$ and $R_3$ are independently hydrogen or hydroxy, alkyl, or alkoxy groups, $R_2$ is hydrogen or an alkyl group, X is an alkylene, oxy, thio, —OC(═O)Ar—, —OC(═O)CH═CH—, or —OCO$(CH_2)_{n4}$— group wherein Ar is an aryl group, m and p are independently 1 or 2, n1 is 0 or an integer up to 5 (for example 0, 1, 2, or 3), n2 is 0 or an integer up to 5 (for example, 0, 1, or 2), n3 is 0 or 1 (typically 0), n4 is at least 1 (for example, up to 8), and Z is —C(═O)OH, —S(═O)$_2$OH, —P(═O)$(OH)_2$, or —OP(═O)$(OH)_2$.

In some embodiments, $R_1$ and $R_3$ are independently hydrogen or hydroxy, methyl, or methoxy groups, $R_2$ is hydrogen or a methyl group, X is a methylene, oxy, thio, —OC(═O)phenyl-, —OC(═O)CH═CH—, or —OCO$(CH_2)_{n4}$— group, n2 is 0, 1 or 2, n3 is 0, n4 is from 1 to 8, and Z is —C(═O)OH.

The alkyl and alkoxy groups present in the primary polymeric binders (for $R^1$, $R^2$, and $R^3$) can be unsubstituted or substituted with one or more halo, nitro, or alkoxy groups, and can have 1 to 3 carbon atoms. Such groups can be linear, branched, or cyclic (that is, "alkyl" also include "cycloalkyl" for purposes of this invention).

When X is alkylene, it can have 1 to 4 carbon atoms and be further substituted similarly to the alkyl and alkoxy groups. In addition, the alkylene group can be a substituted or unsubstituted cycloalkylene group having at least 5 carbon atoms in the ring and chain.

Ar is a substituted or unsubstituted, 6 or 10-membered carbocyclic aromatic group such as substituted or unsubstituted phenyl and naphthyl groups. Typically, Ar is an unsubstituted phenyl group.

In some embodiments, the polymeric binder comprises recurring units represented by Structure (I) wherein a is from about 92 to about 98 mol %, b is from about 2 to about 8 mol % and Z is —C(═O)OH, and is present at a dry coverage of from about 15 to 100 weight % based on the total dry weight of the layer.

The polymeric binders represented by Structure (I) can be prepared in several ways. For example, in some embodiments, X is oxy, n1 and n3 are 0, n2 is 1, and Z is —C(═O)OH, as obtained by modifying phenolic resins with chloroacetic acid.

In other embodiments, X is oxy, n1 and n3 are 0, n2 is 2, and Z is —C(═O)OH, as obtained by modifying phenolic resins with chloropropionic acid.

In addition, novolak resins can be modified with cyclic anhydrides such as maleic anhydride to provide a polymeric binder wherein n1, n2, and n3 are all 0 and X is —OC(═O)CH═CH—, or modified with phthalic anhydrides wherein n1, n2, and n3 are all 0 and X is —OC(═O)Ar—, or modified with saturated cyclic anhydrides wherein n1, n2, and n3 were all 0, n4 was greater than 1, and X is —OC(═O)$(CH_2)$n4.

In general terms, the polymeric binders represented by Structure (I) can be obtained by modifying a phenolic resin (ArOH) by reaction with a haloacetic acid [Halo-$(CH_2)_n$—COOH] in the presence of a halo acid.

Other polymeric binders that may be in the imageable layer include phenolic resins such as novolak and resole resins, and such resins can also include one or more pendant diazo, carboxylate ester, phosphate ester, sulfonate ester, sulfinate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. Nos. 5,705,308 (West et al.) and 5,705,322 (West et al.). Other useful secondary binder resins include acrylate copolymers as described for example in EP 737,896A (Ishizuka et al.), cellulose esters and poly(vinyl acetals) as described for example in U.S. Pat. No. 6,391,524 (Yates et al.), DE 10 239 505 (Timpe et al.), and WO 2004081662 (Memetea et al.).

The polymeric binder can be present in the imageable layer at a dry coverage of from about 15 to 100 weight % (typically from about 30 to about 95 weight %) based on the total dry weight of that layer.

The imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

The single-layer imageable element can be prepared by applying the layer formulation over the surface of the substrate (and any other hydrophilic layers provided thereon) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder or printing sleeve).

The coating weight for the single imageable layer can be from about 0.5 to about 2.5 $g/m^2$ and typically from about 1 to about 2 $g/m^2$.

The selection of solvents used to coat the imageable layer formulation depends upon the nature of the polymeric materials and other components in the formulations. Generally, the imageable layer formulation is coated out of acetone, methyl ethyl ketone, or another ketone, tetrahydrofuran, 1-methoxypropan-2-ol, 1-methoxy-2-propyl acetate, and mixtures thereof using conditions and techniques well known in the art.

Alternatively, the layer(s) may be applied by conventional extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

Multi-Layer Imageable Elements

In general, the multi-layer imageable elements comprise a substrate, an inner layer (also known in the art as an "underlayer"), and an outer layer (also known in the art as a "top layer" or "topcoat") disposed over the inner layer. Before thermal imaging, the outer layer is generally not soluble or removable by an alkaline developer within the usual time allotted for development, but after thermal imaging, the exposed regions of the outer layer are soluble in the alkaline developer. The inner layer is also generally removable by the alkaline developer. An infrared radiation absorbing compound (described above) can also be present in such imageable elements, and is typically present in the inner layer but may optionally be in a separate layer between the inner and outer layers.

The imageable elements are formed by suitable application of an inner layer composition onto a suitable substrate. This substrate can be an untreated or uncoated support but it is usually treated or coated in various ways as described above prior to application of the inner layer composition. The substrate generally has a hydrophilic surface or at least a surface that is more hydrophilic than the outer layer composition. The substrate comprises a support that can be composed of any material that is conventionally used to prepare imageable elements such as lithographic printing plates.

The inner layer is disposed between the outer layer and the substrate. Typically, it is disposed directly on the substrate (including any hydrophilic coatings as described above). The inner layer comprises a first polymeric binder that is removable by the lower pH developer and typically soluble in the developer to reduce sludging of the developer. In addition, the first polymeric binder is usually insoluble in the solvent used to coat the outer layer so that the outer layer can be coated over the inner layer without dissolving the inner layer. Mixtures of these first polymeric binders can be used if desired in the inner layer.

Useful first polymeric binders for the inner layer include (meth)acrylonitrile polymers, (meth)acrylic resins comprising carboxy groups, polyvinyl acetals, maleated wood rosins, styrene-maleic anhydride copolymers, (meth)acrylamide polymers including polymers derived from N-alkoxyalkyl methacrylamide, polymers derived from an N-substituted cyclic imide, polymers having pendant cyclic urea groups, and combinations thereof. First polymeric binders that provide resistance both to fountain solution and aggressive washes are disclosed in U.S. Pat. No. 6,294,311 (noted above).

Useful first polymeric binders include (meth)acrylonitrile polymers, and polymers derived from an N-substituted cyclic imide (especially N-phenylmaleimide), a (meth)acrylamide (especially methacrylamide), a monomer having a pendant cyclic urea group, and a (meth)acrylic acid (especially methacrylic acid). First polymeric binders of this type include copolymers that comprise from about 20 to about 75 mol % and typically about 35 to about 60 mol % or recurring units derived from N-phenylmaleimide, N-cyclohexyl-maleimide, N-(4-carboxyphenyl)maleimide, N-benzylmaleimide, or a mixture thereof, from about 10 to about 50 mol % and typically from about 15 to about 40 mol % of recurring units derived from acrylamide, methacrylamide, or a mixture thereof, and from about 5 to about 30 mol % and typically about 10 to about 30 mol % of recurring units derived from methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. Optionally, these polymers can also include recurring units derived from (meth)acrylonitrile or N-[2-(2-oxo-1-imidazolidinyl)ethyl]-methacrylamide.

The bakeable inner layers described in WO 2005/018934 (Kitson et al.) and U.S. Pat. No. 6,893,783 (Kitson et al.) may also be used.

Other useful first polymeric binders can comprise, in polymerized form, from about 5 mol % to about 30 mol % (typically from about 10 mol % to about 30 mol % of recurring units) derived from an ethylenically unsaturated polymerizable monomer having a carboxy group (such as acrylic acid, methacrylic acid, itaconic acid, and other similar monomers known in the art (acrylic acid and methacrylic acid are preferred), from about 20 mol % to about 75 mol % (typically from about 35 mol % to about 60 mol %) of recurring units derived from N-phenylmaleimide, N-cyclohexylmaleimide, or a mixture thereof, optionally, from about 5 mol % to about 50 mol % (typically when present from about 15 mol % to about 40 mol %) of recurring units derived from methacrylamide, and from about 3 mol % to about 50 mol % (typically from about 10 mol % to about 40 mol % of one or more recurring units derived from monomer compounds of the following Structure (IV):

$$CH_2{=}C(R_2){-}C({=}O){-}NH{-}CH_2{-}OR_1, \qquad (IV)$$

wherein $R_1$ is a $C_1$ to $C_{12}$ alkyl, phenyl, $C_1$ to $C_{12}$ substituted phenyl, $C_1$ to $C_{12}$ aralkyl, or $Si(CH_3)_3$, and $R_2$ is hydrogen or methyl. Methods of preparation of certain of these polymeric materials are disclosed in U.S. Pat. No. 6,475,692 (Jarek).

The first polymeric binder useful in the inner layer can also be hydroxy-containing polymeric material composed of recurring units derived from two or more ethylenically unsaturated monomers wherein from about 1 to about 50 mol % (typically from about 10 to about 40 mol %) of the recurring units are derived from on or more of the monomers represented by the following Structure (V):

$$CH_2{=}C(R_3)C({=}O)NR_4(CR_5R_6)_mOH \qquad (V)$$

wherein $R_3$, $R_4$, $R_5$, $R_6$ are independently hydrogen, substituted or unsubstituted lower alkyl having 1 to 10 carbon atoms (such as methyl, chloromethyl, ethyl, iso-propyl, t-butyl, and n-decyl), or substituted or unsubstituted phenyl, and m is 1 to 20.

Some embodiments of hydroxy-containing first polymeric binders can be represented by the following Structure (VI):

$$-(A)_x-(B)_y-(C)_z- \qquad (VI)$$

wherein A represents recurring units represented by the following Structure (VII):

(VII)

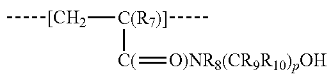

wherein $R_7$ through $R_{10}$ and p are as defined the same as $R_3$ through $R_6$ and m noted above for Structure (V).

In Structure (VI), B represents recurring units comprising acidic functionality or an N-maleimide group, and C represents recurring units different from A and B, x is from about 1 to about 50 mol % (typically from about 10 to about 40 mol %), y is from about 40 to about 90 mol % (typically from about 40 to about 70 mol %), and z is 0 to about 70 mol % (typically from 0 to about 50 mol %), based on total recurring units.

In some embodiments of Structure (VI):

A represents recurring units derived from one or both of N-hydroxymethylacrylamide and N-hydroxymethylmethacrylamide, B represents recurring units derived from one or more of N-phenylmaleimide, N-cyclohexylmaleimide, N-benzylmaleimide, N-(4-carboxyphenyl)maleimide, (meth)acrylic acid, and vinyl benzoic acid, C represents recurring units derived from one or more of a styrenic monomer (such as styrene and derivatives thereof), meth(acrylate) ester, N-substituted (meth)acrylamide, maleic anhydride, (meth)acrylonitrile, allyl acrylate, and a compound represented by the following Structure (VII):

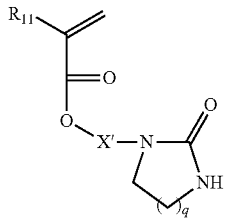

(VII)

wherein $R_{11}$ is hydrogen, methyl, or halo, X' is alkylene having 2 to 12 carbon atoms, q is 1 to 3, x is from about 10 to 40 mol %, y is from about 40 to about 70 mol %, and z is from 0 to about 50 mol %, all based on total recurring units.

In some embodiments for Structure VI, B represents recurring units derived from at least one of N-phenylmaleimide, N-cyclohexylmaleimide, N-benzylmaleimide, N-(4-carboxyphenyl)maleimide in an amount of from about 20 to about 50 mol %, and recurring units derived from at least one of (meth) acrylic acid and vinyl benzoic acid in an amount of from about 10 to about 30 mol %, based on total recurring units.

In such embodiments, C represents recurring units derived from methacrylamide, (meth)acrylonitrile, maleic anhydride, or

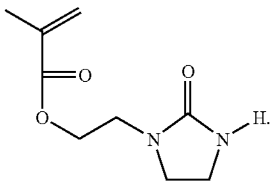

Still other useful first polymeric binders are addition or condensation polymers having a polymer backbone to which are attached pendant phosphoric acid groups, pendant adamantyl groups, or both types of pendant groups. The pendant adamantyl groups are connected to the polymer backbone at least through a urea or urethane linking group but other linking groups can also be present.

Useful first polymeric binders of this type can be represented by the following Structure (VIII):

$$-(A)_x-(B)_y- \quad \text{(VIII)}$$

wherein A and B together represents the polymer backbone in which A further comprises recurring units comprising pendant phosphoric acid groups, pendant adamantyl groups, or both, B further represents different recurring units, x represents 5 to 100 weight %, and y represents 0 to 95 weight %, provided that if A comprises pendant adamantyl groups, such groups are connected to the polymer backbone through a urea or urethane linking group (but other linking groups can also be present).

Such first polymeric binders can be represented by the following Structure (IX):

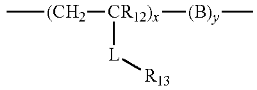

(IX)

wherein $R_{12}$ represents hydrogen, a substituted or unsubstituted lower alkyl group having 1 to 4 carbon atoms (such as methyl, ethyl, n-propyl, or t-butyl), or a halo group.

L represents a direct bond or a linking group comprising 1 or more carbon atoms and optionally 1 or more heteroatoms in the linking chain. Useful linking groups can include, but are not limited to, substituted or unsubstituted, linear or branched alkylene groups having 1 to 10 carbon atoms (such as methylene, methoxymethylene, ethylene, iso-propylene, n-butylene, t-butylene, and n-hexylene), substituted or unsubstituted cycloalkylene groups having 5 to 10 carbon atoms in the cyclic group (such as 1,3-cyclopentylene and 1,4-cyclohexylene), substituted or unsubstituted arylene groups having 6 to 10 carbon atoms in the cyclic group (such as 1,4-phenylene, 3-methyl-1,4-phenylene, or naphthylene), or combinations thereof, such as arylenealkylene, alkylenearylene, and alkylenearylenealkylene groups. The L linking groups can also include one or more oxy, thio, amido, carbonyl, oxycarbonyl, carbonyloxy, carbonamido, sulfonamido, urea, urethane, and carbonate [—O—C(=O)—O—] groups within the linking chain, with or without any of the alkylene, cycloalkylene, and arylene groups described above. L can include combinations of two or more of these groups.

Preferably, L is a direct bond or one or more of alkylene groups having 1 to 4 carbon atoms in the linking chain, carbonyloxy, urea, urethane, alkyleneoxy, alkylenecarbonyloxy, and carboxyalkylene groups. For example, L can comprise at least one —C(=O)O— (carbonyloxy), —NH—C(=O)—NH— (urea), $—C(=O)—O—(CH_2)_2—$, or —NH—C(=O)—O— (urethane) group.

In Structure (IX), $R_{13}$ represents a pendant phosphoric acid group, a pendant adamantyl group, or both types of pendant groups. The solvent-resistant polymer can comprise one or more different recurring units having phosphoric acid groups or one or more different recurring units having adamantyl groups. Alternatively, the polymer can include a mixture of one or more different recurring units having phosphoric acid groups and one or more different recurring units having adamantyl groups. When R' is a pendant adamantyl group, L comprises a urea or urethane linking group within the linking chain.

In referring to "phosphoric acid" groups, it is also intended to include the corresponding salts of the phosphoric acid, including but not limited to, alkali metal salts and ammonium salts. Any suitable positive counterion can be used with the pendant phosphoric acid groups as long as the counterion does not adversely affect the performance of the resulting polymer or other desired imaging properties.

In still other embodiments of Structures VIII and IX, x is from about 5 to about 20 weight % and y is from about 80 to about 95 weight % when A represents recurring units comprising pendant phosphoric acid groups. Alternatively, x is from about 5 to about 40 weight % and B is from about 60 to about 95 weight % when A represents recurring units comprising pendant adamantyl groups.

Useful ethylenically unsaturated polymerizable monomers that can used to provide the A recurring units described above for Structures VIII and IX include, but are not limited to the following compounds represented by the following Structures A1 through A5:

(A1)

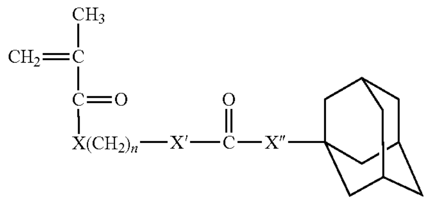

wherein X is oxy, thio, or —NH—, X' is —NH— or oxy, X" is oxy or —NH—, and n is 1 to 6.

(A2)

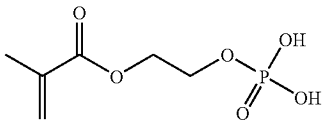

Ethylene glycol methacrylate phosphate (A3)

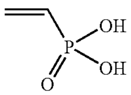

Vinyl phosphonic acid (A4)

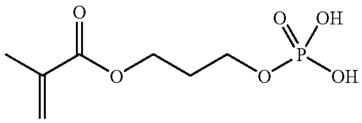

1,3-Propylene glycol methacrylate phosphate (A5)

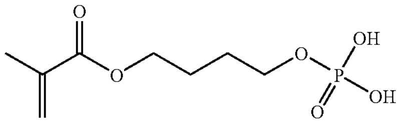

1,4-n-Butylene glycol methacrylate phosphate

In Structures (VIII) and (IX), B represents recurring units derived from one or more ethylenically unsaturated polymerizable monomers that do not have pendant phosphoric acid groups or adamantyl groups. A variety of monomers can be used for providing B recurring units, including styrenic monomers, (meth)acrylamide, (meth)acrylic acids or esters thereof, (meth)acrylonitrile, vinyl acetate, maleic anhydride, N-substituted maleimide, or mixtures thereof.

The recurring units represented by B can be derived from styrene, N-phenylmaleimide, methacrylic acid, (meth)acrylonitrile, or methyl methacrylate, or mixtures of two or more of these monomers.

In some embodiments, the first polymeric binder can be represented by Structure (VIII) described above in which x is from about 5 to about 30 weight % (more typically, from about 5 to about 20 weight %) and B represents recurring units derived from:

a) one or more of styrene, N-phenylmaleimide, methacrylic acid, and methyl methacrylate, wherein these recurring units comprise from 0 to about 70 weight % (typically from about 10 to about 50 weight %) of all recurring units in the solvent-resistant polymer, and b) one or more of acrylonitrile or methacrylonitrile, or mixtures thereof, wherein these recurring units comprise from about 20 to about 95 weight % (typically from about 20 to about 60 weight %) of all recurring units.

Still other useful first polymeric binders comprise a backbone and have attached to the backbone the following Structure Q group:

(Q)

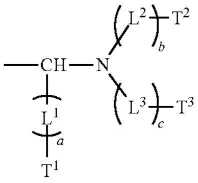

wherein $L^1$, $L^2$, and $L^3$ independently represent linking groups, $T^1$, $T^2$, and $T^3$ independently represent terminal groups, and a, b, and c are independently 0 or 1.

More particularly, each of $L^1$, $L^2$, and $L^3$ is independently a substituted or unsubstituted alkylene having 1 to 4 carbon atoms (such as methylene, 1,2-ethylene, 1,1-ethylene, n-propylene, iso-propylene, t-butylene, and n-butylene groups), substituted cycloalkylene having 5 to 7 carbon atoms in the cyclic ring (such as cyclopentylene and 1,4-cyclohexylene), substituted or unsubstituted arylene having 6 to 10 carbon atoms in the aromatic ring (such as 1,4-phenylene, naphthylene, 2-methyl-1,4-phenylene, and 4-chloro-1,3-phenylene groups), or substituted or unsubstituted, aromatic or non-aromatic divalent heterocyclic group having 5 to 10 carbon and one or more heteroatoms in the cyclic ring (such as pyridylene, pyrazylene, pyrimidylene, or thiazolylene groups), or any combinations of two or more of these divalent linking groups. Alternatively, $L^2$ and $L^3$ together can represent the necessary atoms to form a carbocyclic or heterocyclic ring structure. For example, $L^1$ can be a carbon-hydrogen single bond or a methylene, ethylene, or phenylene group, and $L^2$ and $L^3$ are independently hydrogen, methyl, ethyl, 2-hydroxyethyl, or cyclic $—(CH_2)_2O—(CH_2CH_2)—$ groups.

$T^1$, $T^2$, and $T^3$ are independently terminal groups such as hydrogen, or substituted or unsubstituted alkyl groups having 1 to 10 carbon atoms (such as methyl, ethyl, iso-propyl, t-butyl, n-hexyl, methoxymethyl, phenylmethyl, hydroxyethyl, and chloroethyl groups), substituted or unsubstituted alkenyl groups having 2 to 10 carbon atoms (such as ethenyl and hexenyl groups), substituted or unsubstituted alkynyl groups (such as ethynyl and octynyl groups), substituted or unsubstituted cycloalkyl groups having 5 to 7 carbon atoms in the cyclic ring (such as cyclopentyl, cyclohexyl, and cycloheptyl groups), substituted or unsubstituted heterocyclic groups (both aromatic and non-aromatic) having a carbon atom and one or more heteroatoms in the ring (such as pyridyl, pyrazyl, pyrimidyl, thiazolyl, and indolyl groups), and substituted or unsubstituted aryl groups having 6 to 10 carbon atoms in the aromatic ring (such as phenyl, naphthyl, 3-methoxyphenyl, benzyl, and 4-bromophenyl groups). Alternatively, $T^2$ and $T^3$ together represent the atoms necessary to form a cyclic structure that can also contain fused rings. In addition, when "a" is 0, $T^3$ is not hydrogen.

In some embodiments, the Structure Q group can be directly attached to an α-carbon atom in the polymer backbone, the α-carbon atom also having attached thereto an electron withdrawing group. In other embodiments, the Structure Q group is indirectly attached to the polymer backbone through a linking group.

These first polymeric binders can be prepared by the reaction of an α-hydrogen in the polymer precursor with a first compound comprising an aldehyde group and a second compound comprising an amine group as described in U.S. Patent Application Publication 2005/0037280 (Loccufier et al.).

The first polymeric binders can also be represented by the following Structure (X):

$$-(A)_x-(B)_y- \quad (X)$$

wherein A represents recurring units derived from one or more ethylenically unsaturated polymerizable monomers that comprise the same or different Q groups, B represents recurring units derived from one or more different ethylenically unsaturated polymerizable monomers that do not comprise Q groups.

More particularly, the A recurring units in Structure X can be represented by the following Structure (Xa) or (Xb):

(Xa)

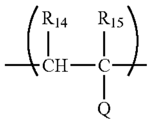

(Xb)

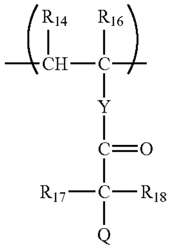

wherein $R_{14}$ and $R_{16}$ are independently hydrogen or a halo, substituted or unsubstituted alkyl having 1 to 7 carbon atoms (such as methyl, ethyl, n-propyl, iso-propyl, or benzyl), or a substituted or unsubstituted phenyl group. For example, $R_{14}$ and $R_{16}$ can be independently hydrogen or a methyl or halo group, and preferably they are independently hydrogen or methyl.

$R_{15}$ in Structure Xa is an electron withdrawing group as defined above including but are not limited to, cyano, nitro, substituted or unsubstituted aryl groups having 6 to 10 carbon atoms in the carbocyclic ring, substituted or unsubstituted heteroaryl groups having 5 to 10 carbon, sulfur, oxygen, or nitrogen atoms in the heteroaromatic ring, $—C(=O)OR_{20}$, and $—C(=O)R_{20}$ groups wherein $R_{20}$ is hydrogen or a substituted or unsubstituted alkyl having 1 to 4 carbon atoms (such as methyl, ethyl, n-propyl, t-butyl), a substituted or unsubstituted cycloalkyl (such as a substituted or unsubstituted cyclohexyl), or a substituted or unsubstituted aryl group (such as substituted or unsubstituted phenyl). The cyano, nitro, $—C(=O)OR_{20}$, and $—C(=O)R_{20}$ groups are useful and cyano, $—C(=O)CH_3$, and $—C(=O)OCH_3$ are more useful.

$R_{17}$ and $R_{18}$ in Structure (Xb) are independently hydrogen or a substituted or unsubstituted alkyl group having 1 to 6 carbon atoms (such as such as methyl, ethyl, n-propyl, t-butyl, n-hexyl), substituted or unsubstituted cycloalkyl having 5 or 6 carbon atoms (such as cyclohexyl), a substituted or unsubstituted aryl group having 6 to 10 carbon atoms (such as phenyl, 4-methylphenyl, and naphthyl), or a $—C(=O)R_{19}$ group wherein $R_{19}$ is a substituted or unsubstituted alkyl group (as defined for $R_{17}$ and $R_{18}$), a substituted or unsubstituted alkenyl group having 2 to 8 carbon atoms (such as ethenyl and 1,2-propenyl), a substituted or unsubstituted cycloalkyl group (as defined above for $R_{17}$ and $R_{18}$), or a substituted or unsubstituted aryl group (as defined above for $R_{17}$ and $R_{18}$). Preferably, $R_{17}$ and $R_{18}$ are independently hydrogen or a substituted or unsubstituted alkyl, cycloalkyl, aryl, or $—C(=O)R_{19}$ groups as defined above wherein $R_{19}$ is an alkyl having 1 to 4 carbon atoms.

In Structure (Xb), Y is a direct bond or a divalent linking group. Useful divalent linking groups include but are not limited to oxy, thio, $—NR_{21}—$, substituted or unsubstituted alkylene, substituted or unsubstituted phenylene, substituted or unsubstituted heterocyclylene, $—C(=O)—$, and $—C(=O)O—$ groups, or a combination thereof wherein $R_{21}$ is hydrogen or a substituted or unsubstituted alkyl, substituted or unsubstituted cycloalkyl, or substituted or unsubstituted aryl group, as defined above for $R_{17}$ and $R_{18}$. For example, Y is a direct bond or an oxy, $—C(=O)O—$, $—C(=O)OCH_2CH_2O—$, or $—C(=O)CH_2CH_2OC(=O)CH_2—$ group.

In Structure (X), x is from about 1 to about 70 mol %, and y is from about 30 to about 99 mol %, based on total recurring units. More typically, x is from about 5 to about 50 mol % and y is from about 50 to about 95 mol %, based on total recurring units.

Also in Structure (X), B can represent recurring units derived from a wide variety of ethylenically unsaturated polymerizable monomers. Particularly useful recurring units are derived from one or more N-substituted maleimides, N-substituted (meth)acrylamides, unsubstituted (meth)acrylamides, (meth)acrylonitriles, or vinyl monomers having an acidic group, and more preferably from one or more N-phenylmaleimides, N-cyclohexylmaleimides, N-benzylmaleimides, N-(4-carboxyphenyl)maleimides, (meth)acrylic acids, vinyl benzoic acids, (meth)acrylamides, and (meth)acrylonitriles. Several of these monomers can be copolymerized to provide multiple types of B recurring units. Useful combinations of B recurring units include those derived from two or more of methacrylic acid, methacrylamide, and N-phenylmaleimide.

The first polymeric binders are the predominant polymeric materials in the inner layer. That is, they comprise more than 50% and up to 100% (dry weight) of the total polymeric materials in the inner layer. However, the inner layer may also comprise one or more primary additional polymeric materials, provided these primary additional polymeric materials do not adversely affect the chemical resistance and solubility properties of the inner layer.

Useful primary additional polymeric materials include copolymers that comprises from about 1 to about 30 mole % of recurring units derived from N-phenylmaleimide, from about 1 to about 30 mole % of recurring units derived from methacrylamide, from about 20 to about 75 mole % of recurring units derived from acrylonitrile, and from about 20 to about 75 mole % of recurring units derived from one or more monomers of the Structure (XI):

$$CH_2=C(R_{23})—CO_2—CH_2CH_2—NH—CO—NH\text{-}p\text{-}C_6H_4—R_{22} \quad (XI)$$

wherein $R_{22}$ is OH, COOH, or $SO_2NH_2$, and $R_{23}$ is H or methyl, and, optionally, from about 1 to about 30 mole % from about 3 to about 20 mole % of recurring units derived from one or more monomers of the Structure (XII):

$$CH_2=C(R_{25})—CO—NH\text{-}p\text{-}C_6H_4—R_{24} \quad (XII)$$

wherein $R_{24}$ is OH, COOH, or $SO_2NH_2$, and $R_{25}$ is H or methyl.

The inner layer may also comprise one or more secondary additional polymeric materials that are resins having activated methylol and/or activated alkylated methylol groups. These “secondary additional polymeric materials” in the inner layer should not be confused with the “second polymeric binder” used in the outer layer.

The secondary additional polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

Useful secondary additional polymeric materials can also include copolymers that comprise from about 25 to about 75 mole % of recurring units derived from N-phenylmaleimide, from about 10 to about 50 mole % of recurring units derived from methacrylamide, and from about 5 to about 30 mole % of recurring units derived from methacrylic acid. These secondary additional copolymers are disclosed in U.S. Pat. Nos. 6,294,311 and 6,528,228 (both noted above).

Thus, the first polymeric binder can be a (meth)acrylic resin comprising carboxy groups, a maleated wood rosin, a styrene-maleic anhydride copolymer, a (meth)acrylamide polymer, a (meth)acrylonitrile polymer, a polymer derived from an N-substituted cyclic imide, a polymer having pendant cyclic urea groups, or polymers derived from an N-alkoxyalkyl methacrylamide.

The first polymeric binder and the primary and secondary additional polymeric materials useful in the inner layer can be prepared by methods, such as free radical polymerization, that are well known to those skilled in the art and that are described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobis(isobutyronitrile) (AIBN). Suitable reaction solvents include liquids that are inert to the reactants and that will not otherwise adversely affect the reaction.

In most embodiments, the inner layer further comprises an infrared radiation absorbing compound (“IR absorbing compounds”) that absorbs radiation at from about 600 to about 1200 and typically at from about 700 to about 1200 nm, with minimal absorption at from about 300 to about 600 nm. Examples of useful radiation absorbing compounds are described above. In most embodiments, the infrared radiation absorbing compound is present only in the inner layer.

The infrared radiation absorbing compound can be present in the multi-layer imageable element in an amount of generally at least 0.5% and up to 30% and typically from about 3 to about 25%, based on the total dry weight of the element. The particular amount of a given compound to be used could be readily determined by one skilled in the art.

The inner layer can include other components such as surfactants, dispersing aids, humectants, biocides, viscosity builders, drying agents, defoamers, preservatives, antioxidants, and colorants.

The inner layer generally has a dry coating coverage of from about 0.5 to about 2.5 g/m$^2$ and typically from about 1 to about 2 g/m$^2$. The first polymeric binders described above generally comprise at least 50 weight % and typically from about 60 to about 90 weight % based on the total dry layer weight, and this amount can be varied depending upon what other polymers and chemical components are present. Any primary and secondary additional polymeric materials (such as a novolak, resole, or copolymers noted above) can be present in an amount of from about 5 to about 45 weight % based on the total dry weight of the inner layer.

The outer layer of the imageable element is disposed over the inner layer and in most embodiments there are no intermediate layers between the inner and outer layers. The outer layer comprises a second polymeric binder that is usually different than the first polymeric binder described above. This second polymeric binder comprises one or more of the polymeric binders as defined above for the single-layer imageable element. The outer layer is usually substantially free of infrared radiation absorbing compounds, meaning that none of these compounds are purposely incorporated therein and insubstantial amounts diffuse into it from other layers.

The one or more second polymeric binders are present in the outer layer at a dry coverage of from about 15 to 100 weight %, typically from about 70 to about 98 weight %, based on total dry weight of the outer layer.

The outer layer also includes the inorganic, non-metallic, inert discrete particles as defined above, to achieve the abrasion resistance advantages of this invention.

The outer layer generally also includes colorants. Useful colorants are described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the developed imageable element.

The outer layer can optionally also include contrast dyes, printout dyes, coating surfactants, dispersing aids, humectants, biocides, viscosity builders, drying agents, defoamers, preservatives, and antioxidants.

The outer layer generally has a dry coating coverage of from about 0.2 to about 2 g/m$^2$ and typically from about 0.4 to about 1.5 g/m$^2$.

There may be a separate layer that is between and in contact with the inner and outer layers. This separate layer can act as a barrier to minimize migration of radiation absorbing compound(s) from the inner layer to the outer layer. This separate “barrier” layer generally comprises a third polymeric binder that is soluble in the alkaline developer. If this third polymeric binder is different from the first polymeric binder(s) in the inner layer, it is typically soluble in at least one organic solvent in which the inner layer first polymeric binders are insoluble. A useful third polymeric binder is a poly(vinyl alcohol). Generally, this barrier layer should be less than one-fifth as thick as the inner layer, and typically less than one-tenth as thick as the inner layer.

Alternatively, there may be a separate layer between the inner and outer layers that contains the infrared radiation absorbing compound(s), which may also be present in the inner layer, or solely in the separate layer.

Preparation of Imageable Elements

The multi-layer imageable element can be prepared by sequentially applying an inner layer formulation over the surface of the hydrophilic substrate (and any other hydrophilic layers provided thereon), and then applying an outer layer formulation over the inner layer using conventional coating or lamination methods. It is important to avoid intermixing of the inner and outer layer formulations.

For example, a multi-layer imageable element can be prepared with an inner layer comprising a first polymeric binder and a radiation absorbing compound, and an ink receptive outer layer comprising a second polymeric binder that: (1) is different than the first polymeric binder, (2) is soluble in an alkaline developer upon exposure to imaging radiation, and (3) includes the inorganic, non-metallic, inert discrete particles as described above.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the inner and outer layers depends upon the nature of the first and second polymeric binders, other polymeric materials, and other components in the formulations. To prevent the inner and outer layer formulations from mixing or the inner layer from dissolving when the outer layer formulation is applied, the outer layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The outer layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and PMA, or a mixture of DEK, PMA, and isopropyl alcohol.

Alternatively, the inner and outer layers may be applied by extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

After drying the layers, the element can be further "conditioned" with a heat treatment at from about 40 to about 90° C. for at least 4 hours (for example, at least 20 hours) under conditions that inhibit the removal of moisture from the dried layers. For example, the heat treatment is carried out at from about 50 to about 70° C. for at least 24 hours. During the heat treatment, the imageable element is wrapped or encased in a water-impermeable sheet material to represent an effective barrier to moisture removal from the precursor, or the heat treatment of the imageable element is carried out in an environment in which relative humidity is controlled to at least 25%. In addition, the water-impermeable sheet material can be sealed around the edges of the imageable element, with the water-impermeable sheet material being a polymeric film or metal foil that is sealed around the edges of the imageable element.

In some embodiments, this heat treatment can be carried out with a stack comprising at least 100 of the same imageable elements, or when the imageable element is in the form of a coil or web. When conditioned in a stack, the individual imageable elements may be separated by suitable interleaving papers. Such papers are available from several commercial sources. The interleaving papers may be kept between the imageable elements after conditioning during packing, shipping, and use by the customer.

Representative methods for preparing multi-layer imageable elements of this invention are shown in Invention Examples 1-7 below. Single layer imageable elements can be similarly prepared using the layer compositions described above.

Imaging and Development

The single- and multi-layer imageable elements can have any useful form including, but not limited to, printing plate precursors, printing cylinders, printing sleeves (solid or hollow cores) and printing tapes (including flexible printing webs). For example, the imageable members can be printing plate precursors useful for providing lithographic printing plates having hydrophilic substrates.

Printing plate precursors can be of any size or shape (for example, square or rectangular) having the requisite one or more imageable layers disposed on a suitable substrate. Printing cylinders and sleeves are known as rotary printing members having a substrate and at least one imageable layer in cylindrical form. Hollow or solid metal cores can be used as substrates for printing sleeves.

During use, the single- and multi-layer imageable elements are exposed to a suitable source of radiation such as UV, visible, or infrared radiation, depending upon the radiation absorbing compound present in the element, for example at a wavelength of from about 300 to about 1400 nm. In some embodiments, imaging can be carried out using an infrared laser at a wavelength of from about 600 to about 1500 nm and typically from about 700 to about 1200 nm. The lasers used to expose the imageable elements are usually diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Creo Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 mJ/$cm^2$, and typically from about 75 to about 400 mJ/$cm^2$.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable lower pH developer removes the exposed regions of the outermost layer and the underlying portions of underlayers (such as an inner layer), and exposes the hydrophilic surface of the substrate. Thus, the imageable elements are "positive-working" (for example, positive-working lithographic printing plate precursors). The exposed (or imaged) regions of the hydrophilic surface repel ink while the non-exposed (or non-imaged) regions accept ink.

Development is carried out for a time sufficient to remove the imaged (exposed) regions of the imaged element, but not long enough to remove the non-exposed regions. Thus, the imaged (exposed) regions of the imageable layer are described as being "soluble" or "removable" in the alkaline developer because they are removed, dissolved, or dispersed within the alkaline developer more readily than the non-imaged (non-exposed) regions. Thus, the term "soluble" also means "dispersible".

Aqueous alkaline developers generally have a pH of from about 8 to about 14 and more typically of at least 12, or of at least 13. Useful alkaline aqueous developers include 3000 Developer, 9000 Developer, GoldStar® Developer, GoldStar® Plus Developer, GoldStar® Premium, GREENSTAR Developer, ThermalPro Developer, PROTHERM Developer, MX1813 Developer, and MX1710 Developer (all available from Eastman Kodak Company), as well as Fuji HDP7 Developer (Fuji Photo) and Energy CTP Developer (Agfa). These compositions generally include surfactants, chelating agents (such as salts of ethylenediaminetetraacetic acid), and alkaline components (such as inorganic metasilicates, organic metasilicates, hydroxides, and bicarbonates).

Such alkaline developers can also include one or more "coating-attack suppressing agents" that are developer-soluble compounds that suppress developer attack of the outer layer. "Developer-soluble" means that enough of the agent(s) will dissolve in the developer to suppress attack by the developer. Mixtures of these compounds can be used. Typically, the coating-attack suppressing agents are developer-soluble polyethoxylated, polypropoxylated, or polybutoxylated compounds that include recurring $-(CH_2-CHR_a-O-)-$ units in which $R_a$ is hydrogen or a methyl or ethyl group. Each agent can have the same or different recurring units (in a random or block fashion). Representative compounds of this type include but are not limited to, polyglycols and polycondensation products having the noted recurring units. Examples of such compounds and representative sources, tradenames, or methods of preparing are described for example in U.S. Pat. No. 6,649,324 (Fiebag et al.) that is incorporated herein by reference.

Organic solvent-containing alkaline developers may also be useful. These developers generally have a lower pH (for example, below 12) and are generally single-phase solutions of one or more organic solvents that are miscible with water, such as 2-ethylethanol and 2-butoxyethanol. Representative solvent-containing alkaline developers include ND-1 Developer, 955 Developer, 956 Developer, 989 Developer, and 980 Developer (all available from Eastman Kodak Company), HDN-1 Developer (available from Fuji), and EN 232 Developer (available from Agfa).

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. The imaged element can be immersed in the developer. In all instances, a developed image is produced, particularly in a lithographic printing plate.

Following development, the imaged element can be rinsed with water and dried in a suitable fashion. The dried element can also be treated with a conventional gumming solution (preferably gum arabic).

The imaged and developed element can also be baked in a postbake operation that can be carried out to increase run length of the resulting imaged element. Baking can be carried out, for example at from about 220° C. to about 240° C. for from about 7 to about 10 minutes, or at about 120° C. for 30 minutes.

A lithographic ink and fountain solution can be applied to the printing surface of the imaged element for printing. The non-exposed regions of the outermost layer take up ink and the hydrophilic surface of the substrate revealed by the imaging and development process takes up the fountain solution. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

EXAMPLES

The components and materials used in the examples and analytical methods were as follows. Unless otherwise indicated, the components can be obtained from various commercial sources such as Aldrich Chemical Co. (Milwaukee, Wis.).

BLO is γ-butyrolactone.

Byk® 307 is a polyethoxylated dimethylpolysiloxane copolymer that is available from Byk Chemie (Wallingford, Conn.) in a 25 wt. % xylene/-methoxypropyl acetate solution.

Copolymer A represents a copolymer having recurring units derived from N-phenylmaleimide, methacrylamide, and methacrylic acid, (45:35:20 monomer mole % ratio) using conventional conditions and procedures.

DEK represents diethyl ketone.

Dowanol® PM is propylene glycol methyl ether that was obtained from Dow Chemical (Midland, Mich.). It is also known as PGME.

Dowanol® PMA is 1-methoxy-2-propyl acetate (or "PMA").

Ethyl violet is assigned C.I. 42600 (CAS 2390-59-2, $\lambda_{max}$=596 nm) and has a formula of p-$(CH_3CH_2)_2NC_6H_4)_3C^+$ $Cl^-$.

GP649D99 Resole is a resole resin as supplied by Georgia-Pacific (Atlanta, Ga.).

IR Dye A (Trump) is represented by the following formula and can be obtained from Eastman Kodak Company (Rochester, N.Y.):

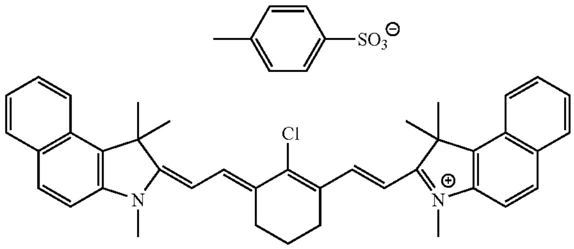

IR Dye A

MEK represents methyl ethyl ketone.

PD494 is a novolak resin condensed from m-/p-cresol with formaldehyde and available from Borden Chemical Company (Columbus, Ohio).

Primisil 511 are aluminum oxide particles available from Lehmann & Voss (Germany).

RAR 62 is a polymer having the following structure:

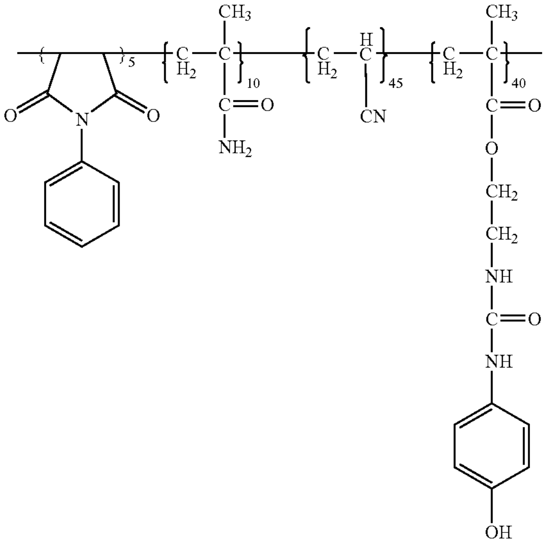

Substrate A is a 0.3 mm gauge aluminum sheet that had been electrograined, anodized, and subjected to treatment poly(vinyl phosphonic acid).

Syloid AL-1 contains silica particles available from Grace Inc. (Canada).

TN13 is a 15 mole % tosylated N13 resin available from Eastman Kodak (Rochester, N.Y.). N13 is an m-cresol novolak that was obtained from Eastman Kodak (Rochester, N.Y.).

VP Disp.CP1030 is a 30% dispersion of Aerosil R9200 that is a hydrophobic, fumed silica in Dowanol® PMA. The silica particles have a number average particle size of about 15 nm.

Invention Examples 1-7 and Comparative Examples 1-3

Multi-layer imageable elements of the present invention and Comparative imageable elements were prepared as follows:

Inner layer formulation 1 was prepared by dissolving Copolymer A (5.80 g), RAR 62 (1.5 g), GP649D99 Resole (4.16 g), Byk® 307 (0.05 g), and IR Dye A (1.5 g) in 130 ml of a solvent mixture comprising MEK (45 wt. %), PMA (35 wt. %), BLO (10 wt. %), and water (10 wt. %) and coating it onto Substrate A and drying at 135° C. for 45 seconds to provide a dry coating weight shown in TABLE I below.

Inner layer formulation 2 was prepared by dissolving Copolymer A (5 g) and IR Dye A (0.7 g) in 90 ml of a solvent mixture comprising MEK (45 wt. %), PMA (35 wt. %), BLO (10 wt. %), and water (10 wt. %) and coating it onto Substrate A and drying at 135° C. for 45 seconds to provide a dry coating weight of 1.35 g/m$^2$.

Outer layer formulations were prepared by dissolving the components shown in TABLE I (in grams) below in 40 g of a solvent mixture (DEK:PMA 92:8 weight ratio), coated over the dried inner layer 1 except in the Comparative Example 3 and Invention Example 7 where the inner layer formulation 2 was used, and dried at 135° C. for 45 seconds to provide a dry coating weight shown in TABLE 1 g/m$^2$.

TABLE I

| | VP Disp. CP1030 | TN13 | PD 494 | Ethyl violet | Byk ® 307 | Inner Layer coverage (g/m$^2$) | Outer Layer coverage (g/m$^2$) |
|---|---|---|---|---|---|---|---|
| Comparative Example 1 | 0 | 2.38 | 0 | 0.032 | 0.030 | 1.58 | 0.65 |
| Invention Example 1 | 0.79 (9 wt. %) | 2.38 | 0 | 0.032 | 0.030 | 1.48 | 0.63 |
| Invention Example 2 | 2.38 (23 wt. %) | 2.38 | 0 | 0.032 | 0.030 | 1.51 | 0.61 |
| Invention Example 3 | 3.97 (33 wt. %) | 2.38 | 0 | 0.032 | 0.030 | 1.53 | 0.73 |
| Comparative Example 2 | 0 | 0 | 2.38 | 0.032 | 0.030 | 1.58 | 0.78 |
| Invention Example 4 | 1.08 | 0 | 2.38 | 0.032 | 0.030 | 1.48 | 0.65 |
| Invention Example 5 | 1.74 | 0 | 2.38 | 0.032 | 0.030 | 1.55 | 0.66 |
| Invention Example 6 | 2.24 | 0 | 2.38 | 0.032 | 0.030 | 1.52 | 0.68 |
| Comparative Example 3 | 0 | 0 | 2.38 | 0.032 | 0.030 | 1.35 | 0.68 |
| Invention Example 7 | 2.24 | 0 | 2.38 | 0.032 | 0.030 | 1.35 | 0.72 |

Samples of the resulting imageable elements were IR-imaged at 4-10 W in 1 W steps on a Creo Quantum® 800 imagesetter. The imaged elements were developed with GOLDSTAR® Premium Developer (Eastman Kodak Company, Norwalk, Conn.) at 23° C. in a Mercury processor at 100 cm/min to provide lithographic printing plates. The Clear Point of each imaged plate is noted in TABLE II below. "Clear point" refers to the minimum imaging energy required to obtain a clean background in the non-imaged regions. All of the printing plates showed good resolution at regular exposures as indicated by the 50% dot measurement at 200 lpi.

Abrasion Resistance Test: The abrasion resistance of both the unbaked and baked printing plates was tested. The printing plates were placed in an oven for 45 minutes at 245° C. and baked. A plate sample of 19.5 cm×12 cm was used for the Abrasion Resistance Test using a plynometer. For the unbaked printing plates, an aqueous slurry of 5% Syloid particles in a 4% Combifix XL 805409 and 10% isopropanol was used and for the baked printing plates the slurry was made up with 1.5% Primisil particles. In each case, the outer layer coating loss after 5 minutes of rubbing was noted.

Scratch Sensitivity Test: Scratch sensitivity was assessed by placing a 1500 g weight on smooth metal discs on top of the printing plate covered with a sheet of interleaf paper (42 $g/m^2$ obtained from Badger, USA). The interleaf paper was pulled at a constant speed and subsequently the imaged elements were processed in Goldstar® Premium Developer (pH of about 14) at 100 cm/min, except for Comparative Example 3 and Invention Example 7 that were processed using 956 Developer (pH of about 10) at the same speed. The printing plates were assessed for scratches and given a relative figure using a scale of 0 to 10 where 10 indicated the highest level of scratches and 1 indicated no scratches.

TABLE II

| Element | Clear Point ($mJ/cm^2$) | Regular Exposure ($mJ/cm^2$) | 50% Dot at 200 lpi at regular exposure | Abrasion Test ("Unbaked") | Abrasion Test ("Baked") | Clear Point ($mJ/cm^2$) | Scratch Test |
|---|---|---|---|---|---|---|---|
| Comparative Example 1 | 87 | 120 | 50.1 | 45% | 43% | 87 | 10 |
| Invention Example 1 | 87 | 120 | 50.7 | 39% | 38% | 87 | 5 |
| Invention Example 2 | 87 | 120 | 50.5 | 15% | 16% | 87 | 2 |
| Invention Example 3 | 92 | 120 | 50.9 | 14% | 17% | 92 | 1 |
| Comparative Example 2 | 75 | 100 | 50.5 | 54% | 45% | 75 | 10 |
| Invention Example 4 | 75 | 100 | 50.4 | 36% | 36% | 75 | 7 |
| Invention Example 5 | 75 | 100 | 50.8 | 30% | 30% | 75 | 3 |
| Invention Example 6 | 83 | 100 | 50.4 | 25% | 22% | 83 | 1 |
| Comparative Example 3 | 87 | 120 | 50.3 | 50% | — | 87 | 7 |
| Invention Example 7 | 87 | 120 | 50.4 | 25% | — | 87 | 3 |

The results shown in TABLE II demonstrate that the abrasion resistance of the imageable elements is improved through the use of inorganic, non-metallic, inert discrete particles (silica particles, VP Disp.CP1030). The most important feature that was been improved is the scratch sensitivity. The outer inner in the multi-layer elements are responsible for protecting the image. Any damage to that layer causes image attack or holes in the image areas that pose a major problem in manufacturing, packaging, and transport. The improved scratch sensitivity of the imageable elements of this invention provides a potential solution to this problem.

Figure 1B:
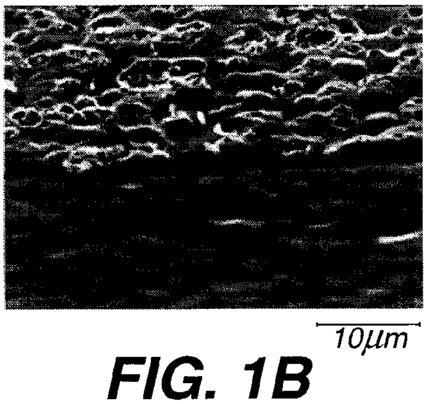
Figure 2A:
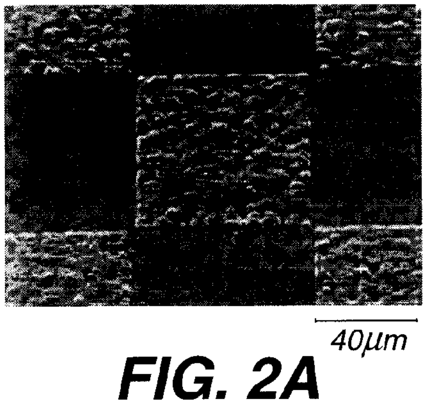
Figure 2B:
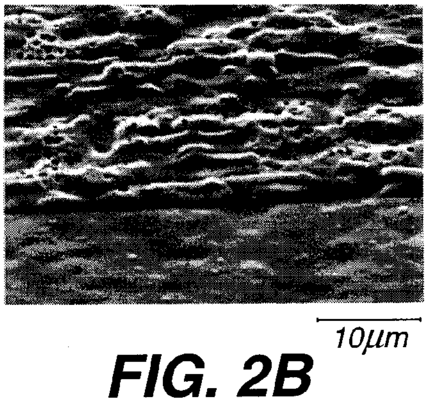
Figure 3A:
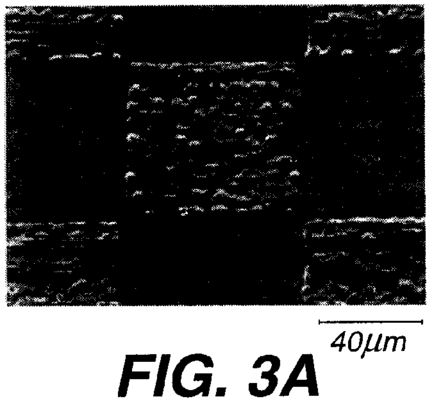
Figure 3B:
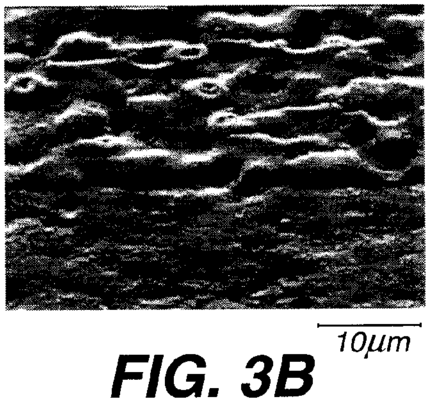
Figure 4A:
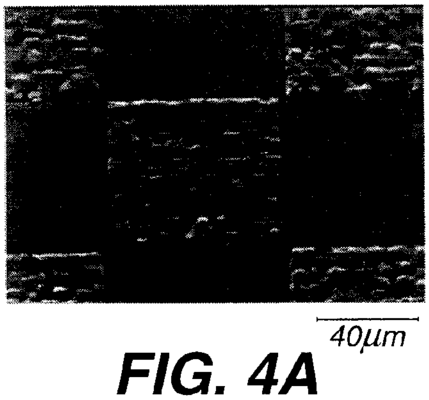
Figure 4B:
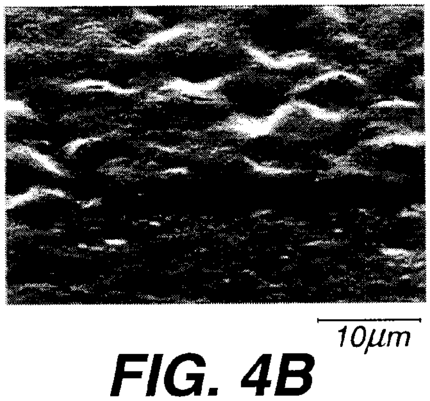

Another advantage that is believed possible with this invention is the reduction in dusting. This advantage is shown by comparing FIGS. 1*a* and 1*b* (Comparative Example 1) with FIGS. 2*a* and 2*b* (Invention Example 1), FIGS. 3*a* and 3*b* (Invention Example 2), and FIGS. 4*a* and 4*b* (Invention Example 3) that are scanning electron micrograph (SEM) images taken of the dried outer surface layer the respective elements. FIGS. 1*a*, 2*a*, 3*a*, and 4*a* are images at 625 magnification and FIGS. 1*b*, 2*b*, 3*b*, and 4*b* are images at 2500 magnification.

These FIGS. indicate that the silica particles used in the outer layer are sub-micron in size. The SEM images also showed that the outer layers containing the silica particles according to the present invention showed fewer or no holes in the exposed regions, which is a different behavior from known multi-layer imageable elements as demonstrated in Comparative Example 1. Thus, the inclusion of silica particles in the outer layer formulation should reduce the amount of dusting that is also a problem encountered with the use of certain platesetters.

The invention has been described in detail with particular reference to certain preferred embodiments thereof, but it will be understood that variations and modifications can be effected within the spirit and scope of the invention.

The invention claimed is:

1. A multi-layer positive-working imageable element that is a positive-working lithographic printing plate precursor comprising a hydrophilic aluminum-containing substrate having thereon, an inner imageable layer comprising a first polymeric binder disposed on the substrate and an outer imageable layer comprising a second polymeric binder disposed over the inner imageable layer, wherein:

the second polymeric binder is different from the first polymeric binder, the outer imageable layer comprises inorganic, non-metallic, inert discrete particles dispersed within the second polymeric binder that is insoluble in alkaline developer before thermal imaging and soluble in said alkaline developer after thermal imaging, said element further comprises a radiation absorbing compound only in the inner imageable layer, and said discrete particles have an average particle size of from 10 nm to 300 nm, and are present in said outer imageable layer in an amount of from about 5 to about 30% based on total outer imageable layer dry weight wherein said discrete particles are composed of silica, aluminum oxide, or titanium dioxide.

2. The element of claim 1 wherein said radiation absorbing compound is an infrared radiation absorbing compound that is present in an amount of from about 1 to about 25% based on the total dry weight of the inner imageable layer.

3. A method of providing an image comprising:

A) imaging the multi-layer positive-working imageable element of claim 1 to provide an imaged element with exposed regions and non-exposed regions, and B) developing said imaged element to remove only said exposed regions with an alkaline developer.

4. The method of claim 3 wherein said imaging is carried out using an infrared laser at a wavelength of from about 700 to about 1400 nm.

5. The method of claim 3 wherein said developing is carried out using an alkaline developer having a pH of from about 8 to about 14.

6. The method of claim 3 wherein said imageable element comprised discrete silica particles in the outer imageable layer.

7. The element of claim 1 wherein the inorganic, non-metallic, inert discrete particles are present only in the outer imageable layer.

8. The element of claim 1 wherein the inner layer has a dry coating coverage of from about 1 to about 2 $g/m^2$, and the outer layer has a dry coating coverage of from about 0.4 to about 1.5 $g/m^2$.

9. A plurality of multi-layer positive-working imageable elements arranged in a stack with interleaving paper between each individual multi-layer positive-working imageable element, each multi-layer positive-working imageable element comprising a substrate having thereon, an inner imageable layer comprising a first polymeric binder disposed on the substrate and an outer imageable layer comprising a second polymeric binder disposed over the inner imageable layer, wherein:

the second polymeric binder is different from the first polymeric binder, only the outer imageable layer comprises inorganic, non-metallic, inert discrete particles dispersed within the second polymeric binder that is insoluble in alkaline developer before thermal imaging and soluble in is the alkaline developer after thermal imaging, the element further comprises a radiation absorbing compound only in the inner imageable layer, and the discrete particles have an average particle size of from 10 nm to 300 nm, and are present in the outer imageable layer in an amount of from about 5 to about 30% based on total outer imageable layer dry weight.

10. The plurality of multi-layer positive-working imageable elements of claim 9 wherein said discrete particles in each element are composed of silica, aluminum oxide, or titanium dioxide.

11. The plurality of multi-layer positive-working imageable elements of claim 9 wherein, in each element, said radiation absorbing compound is an infrared radiation absorbing compound that is present in an amount of from about 1 to about 25% based on the total dry weight of the inner imageable layer.

12. The plurality of multi-layer positive-working imageable elements of claim 9 wherein each element is a lithographic printing plate precursor and said substrate of each element is a hydrophilic aluminum-containing substrate.

13. The plurality of multi-layer positive-working imageable elements of claim 9 wherein the inorganic, non-metallic, inert discrete particles are present only in the outer imageable layer of each element.

14. The plurality of multi-layer positive-working imageable elements of claim 9 wherein, in each element, the inner layer has a dry coating coverage of from about 1 to about 2 $g/m^2$, and the outer layer has a dry coating coverage of from about 0.4 to about 1.5 $g/m^2$.

* * * * *